(12) United States Patent
Laermer et al.

(10) Patent No.: US 8,501,516 B2
(45) Date of Patent: Aug. 6, 2013

(54) METHOD FOR PRODUCING MICROMECHANICAL PATTERNS HAVING A RELIEF-LIKE SIDEWALL OUTLINE SHAPE OR AN ADJUSTABLE ANGLE OF INCLINATION

(75) Inventors: Franz Laermer, Weil der Stadt (DE); Tino Fuchs, Tuebingen (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 52 days.

(21) Appl. No.: 12/740,607

(22) PCT Filed: Oct. 13, 2008

(86) PCT No.: PCT/EP2008/063703
§ 371 (c)(1),
(2), (4) Date: Oct. 3, 2011

(87) PCT Pub. No.: WO2009/059868
PCT Pub. Date: May 14, 2009

(65) Prior Publication Data
US 2012/0018779 A1    Jan. 26, 2012

(30) Foreign Application Priority Data
Nov. 5, 2007    (DE) .................. 10 2007 052 661

(51) Int. Cl.
*H01L 21/306*    (2006.01)
(52) U.S. Cl.
USPC ............. 438/50; 438/52; 438/518; 438/705; 257/E21.219
(58) Field of Classification Search
USPC ............. 438/50, 52, 518, 705; 257/E21.219
See application file for complete search history.

(56) References Cited

U.S. PATENT DOCUMENTS

| 5,501,893 A | 3/1996 | Laermer et al. |
| 2003/0124761 A1* | 7/2003 | Baert et al. ................. 438/50 |
| 2007/0098344 A1 | 5/2007 | Judong |

FOREIGN PATENT DOCUMENTS

DE    4241045    5/1994

OTHER PUBLICATIONS

International Search Report, PCT International Patent Application No. PCT/EP2008/063703, dated Jul. 7, 2009.
Christina Leinenbach et al.: "A novel sacrificial layer technology based on highly selective etching of silicon-germanium in CLF3" Micro Electro Mechanical Systems, 2007. Mems. IEEE 20th International Conference on, IEEE, PI, Jan. 1, 2007 pp. 65-68 XP031203768 ISBN: 978-1-4244-0950-1.
Soulimane, S. et al.: "Polymeric material sacrificial layer for MEMS fabrication" Nanofun-Poly International Conference, XX, XX, May 29, 2006 XP002432492.

* cited by examiner

*Primary Examiner* — Zandra Smith
*Assistant Examiner* — Toniae Thomas
(74) *Attorney, Agent, or Firm* — Kenyon & Kenyon LLP

(57) ABSTRACT

A method for producing micromechanical patterns having a relief-like sidewall outline shape or an angle of inclination that is able to be set, the micromechanical patterns being etched out of a SiGe mixed semiconductor layer that is present on or deposited on a silicon semiconductor substrate, by dry chemical etching of the SiGe mixed semiconductor layer; the sidewall outline shape of the micromechanical pattern being developed by varying the germanium proportion in the SiGe mixed semiconductor layer that is to be etched; a greater germanium proportion being present in regions that are to be etched more strongly; the variation in the germanium proportion in the SiGe mixed semiconductor layer being set by a method selected from the group including depositing a SiGe mixed semiconductor layer having varying germanium content, introducing germanium into a silicon semiconductor layer or a SiGe mixed semiconductor layer, introducing silicon into a germanium layer or an SiGe mixed semiconductor layer and/or by thermal oxidation of a SiGe mixed semiconductor layer.

19 Claims, 3 Drawing Sheets

METHOD FOR PRODUCING MICROMECHANICAL PATTERNS HAVING A RELIEF-LIKE SIDEWALL OUTLINE SHAPE OR AN ADJUSTABLE ANGLE OF INCLINATION

FIELD OF THE INVENTION

The present invention relates to a method for producing micromechanical patterns having a relief-like sidewall outline shape or an adjustable angle of inclination on a silicon semiconductor substrate.

BACKGROUND INFORMATION

In the production of micromechanical patterns or components, silicon is mostly used as a functional layer, based on its properties, which are superb for this application. This functional silicon layer may be supplemented by additional layers, for instance, oxide or nitride layers, whereby a build-up of multilayers may occur. A selective removal of a certain layer, for instance, a so-called sacrificial layer, on a silicon semiconductor substrate is a conventional measure in production methods of semiconductor components, especially in methods for producing self-supporting structures. In the production of micromechanical sensors, for example, a sacrificial layer is developed on a semiconductor substrate, onto which further patterned layers are deposited and patterned. This sacrificial layer is subsequently selectively removed to expose the further patterns. Frequently used sacrificial layers are silicon-germanium (SiGe) mixed semiconductor layers, since silicon-germanium layers are selectively removable from silicon layers. By the controlled removal of the sacrificial layer of SiGe, a self-supporting structure is generated that is situated on top of it.

In the case of using SiGe layers, in the further processing, the development of a diffusion barrier to adjacent layers based on silicon will become necessary, since in response to the exceeding of appropriate activating energies, such as in high temperature processes or tempering processes of the further sensor production, germanium would diffuse into adjacent silicon layers. Silicon oxide layers are suitable diffusion barriers, for example.

Besides exposing micromechanical patterns, such as sensor structures, using sacrificial layer etching of SiGe layers, the patterning of layer arrangements based on silicon is also indispensable in systems technology, above all for producing micromechanical patterns. Thus, besides the complete removal of a sacrificial layer, it is normally required to produce micromechanical patterns which have specified sidewall profiles, especially vertical sidewall profiles or conical sidewall profiles.

Such sidewall profiles are normally produced using a fluorine-based silicon deep-etching method that is described in German Patent No. DE 4241045 C1. In this case, the sidewalls, for instance, of sensor patterns to be produced are produced by complementing etching and passivating steps, using a teflon-type polymer as passivating agent and a fluorine-containing etching reagent. However, anisotropic plasma etching methods are very costly. Furthermore, such applied teflon-type protective layers onto the sidewalls of the patterns are often not sufficient for avoiding an etching attack during the plasma etching step.

SUMMARY

An example method according to the present invention for producing micromechanical patterns having a relief-like sidewall outline shape or an adjustable angle of inclination may have the advantage that new, plasma-less, anisotropic patterning possibilities are able to be provided for micromechanical patterns.

This is achieved, according to an example embodiment of the present invention, by etching the micromechanical patterns out of a SiGe mixed semiconductor layer, that is present or deposited on a silicon semiconductor substrate, by dry chemical etching of the SiGe mixed semiconductor layer, the sidewall outline shape of the micromechanical pattern being developed by varying the germanium proportion in the SiGe mixed semiconductor layer that is to be etched; a greater germanium proportion being present in regions that are to be etched more strongly; the variation of the germanium proportion in the SiGe mixed semiconductor layer being adjusted by a method selected from the group including depositing a SiGe mixed semiconductor layer having a varying germanium content, introducing germanium into a silicon semiconductor layer or a SiGe mixed semiconductor layer, introducing silicon into a germanium layer or a SiGe mixed semiconductor layer and/or by thermal oxidation of a SiGe mixed semiconductor layer.

An example method according to the present invention particularly makes possible undertaking the patterning of SiGe mixed semiconductor layers, by a variation in the germanium concentration, the patternings having specifically adjustable conical sidewall outline shapes. It may be furthermore of advantage, in this connection, if the production of conical sidewall outline shapes is made possible without the usual considerable process technology effort, such as temperature changes, costly variations in passivating and etching cycles in the patterning process and large passivating gas quantities.

One preferred variation in the germanium proportion is the development of a concentration gradient. A variation of the germanium proportion or a concentration gradient of germanium in a SiGe mixed semiconductor layer may advantageously have a direct effect on the etching rate in dry chemical etching, without one's having to change the etching parameters in the method. Thus, in ranges of higher germanium concentration in the layer, a greater removal takes place of the SiGe mixed semiconductor layer than in ranges of lower germanium concentration, whereby one is able to develop a relief-like or a conical sidewall outline shape.

After the dry chemical etching process, additional temperature profiles or tempering processes provided for the production of a micromechanical component may be run, which are able to remove the concentration gradient. The sidewall profile produced of the SiGe mixed semiconductor layer is no longer changed by this.

It may be of great advantage if the angle of inclination of the conical sidewall outline shape is able to be optionally adjusted via the selection of the composition of the SiGe mixed semiconductor layer.

It is also advantageous, in this instance, that in an etching step the production of different edge angles is made possible by the fact that regions of the SiGe mixed semiconductor layer are able to have different germanium concentrations.

Micromechanical patterns having a relief-like sidewall outline shape or an adjustable angle of inclination, in particular, an adjustable conical sidewall outline shape, are also suitable especially as a sacrificial layer, onto which additional layer systems may be deposited, to which the conical sidewall outline shape adjusted in the SiGe mixed semiconductor layer is transferred. This makes possible an application in the production of diaphragms not having level mounting. Furthermore, a conical sidewall outline shape advantageously permits the depositing of layers in which there might be problems with steps that were to be coated vertically, due to a relatively bad conformity, for instance, in PECVD processes, sputter processes or in the case of particularly thin layers.

BRIEF DESCRIPTION OF THE DRAWINGS

Exemplary embodiments of the present invention are depicted in the figures and described in greater detail below.

DETAILED DESCRIPTION OF EXAMPLE EMBODIMENTS

Figure 1A:
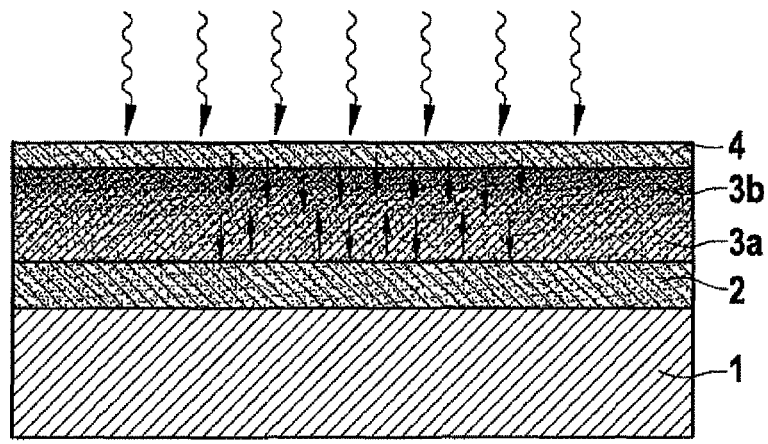
FIG. 1a-1c show schematic cross sectional views of production steps of micromechanical patterns having a conical sidewall outline shape, according to a first specific example embodiment of the present invention.

In the figures, like reference numerals designate like or functionally equivalent components.

The method according to the present invention is described below in exemplary fashion.

Figure 1B:
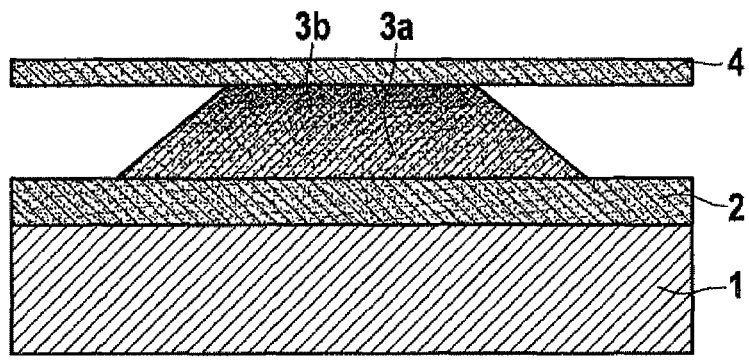
Figure 1C:
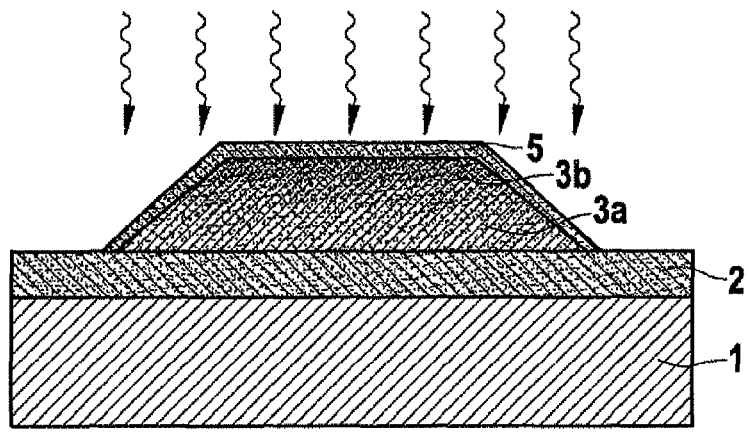

FIGS. 1a to 1c show a possible production method of micromechanical patterns having conical sidewall outline shapes. For the production of the layer system shown in FIG. 1a, a first layer of a dielectric 2 was first deposited onto a silicon substrate 1. Dielectric 2 can be a usual thermal insulating oxide, for instance, silicon dioxide, silicon nitride, various glasses or other ceramic layers. One preferred dielectric 2 is silicon dioxide. Depositing processes from semiconductor technology may be used for depositing this layer. A possible layer thickness of a dielectric 2 may be in the range of a few micrometers, and amounts to 2.5 µm, for example. In this exemplary embodiment the silicon was present as silicon substrate, but it may be provided that the silicon be present as a layer on a substrate. Usually, the substrate is positioned in a usual process chamber during the method.

A SiGe mixed semiconductor layer, preferably a poly-SiGe mixed semiconductor layer, was applied onto the layer of dielectric 2. Both polycrystalline and monocrystalline SiGe mixed semiconductor layers are suitable, a poly-SiGe layer being preferred, however. The thickness of the SiGe mixed semiconductor layer is preferably in a range of 0.5 µm to 5 µm. The thickness of a deposited SiGe mixed semiconductor layer may amount to 1.5 µm, for example. The proportion of germanium in an $Si_{1-x}Ge_x$ mixed semiconductor layer may vary as required, a possible value range for x is in the range of $\geq 0.01$ to $\leq 0.5$, preferably in the range of $\geq 0.1$ to $\leq 0.3$. It is greatly preferred that the content of germanium have a value x<0.5, since, during a subsequent thermal oxidation, this may lead to a qualitatively high value $SiO_2$ that is as pure as possible.

The development of a concentration gradient of germanium in the SiGe mixed semiconductor layer took place by thermal oxidation, in a subsequent method step. Because of the thermal oxidation, shown in the figures by wavy arrows, a layer of a thermal oxide 4, preferably of a pure silicon oxide, formed at the surface of the SiGe mixed semiconductor layer. The germanium that was not incorporated into the silicon oxide formed during the thermal oxidation process is integrated into the SiGe mixed semiconductor layer that lies under the oxide. Because of this separation of the germanium from the formed oxide and into the SiGe mixed semiconductor layer lying under it, a concentration gradient was formed in this layer. The thermal oxidation is preferably carried out at temperatures that are high enough to activate diffusion of the germanium which will let the germanium diffuse as deep as possible into the SiGe mixed semiconductor layer. The temperatures for the thermal oxidation of the SiGe mixed semiconductor layer are preferably in a range of $\geq 800°$ C. to $\leq 1300°$ C. The thermal oxidation is especially preferably carried out at a temperature of about 1100° C.

Because of the diffusion of the germanium during the thermal oxidation, an increased germanium proportion forms in an upper area of SiGe mixed semiconductor layer 3b, which lies at the boundary surface towards developed thermal oxide 4. Areas of SiGe mixed semiconductor layer 3a lying below the latter have a lower germanium proportion, depending on the diffusion. The concentration gradient of germanium thus formed in the SiGe mixed semiconductor layer advantageously has a direct effect on the etching rate of the dry chemical etching using etching agents such as $ClF_3$, without having to change the etching parameters in the example method. The etching rate of SiGe increases with an increasing germanium proportion in the layer, so that in upper layer area 3b there is a greater removal of the SiGe layer than in lower area 3a, which enables a conical sidewall outline shape to be developed, as shown in FIG. 1b.

$ClF_3$ is a preferred etching gas. As shown in FIG. 1b, because of a dry chemical, plasma-less etching of the SiGe layer using an etching gas, according to the present invention, a highly selective etching of the SiGe layer was effected. When $ClF_3$ is used as the etching gas for etching a SiGe layer, the selectivity compared to a pure silicon substrate layer amounts to about 4000:1 to 10000:1, and compared to the thermal oxide, the selectivity even amounts to about 100000:1. Consequently, because of the dry chemical etching process, neither silicon substrate 1 nor thermal oxide 4 is removed by the etching.

After the dry chemical etching, the layer of thermal oxide 4 may be removed. As shown in FIG. 1c, SiGe mixed semiconductor layer having the conical sidewall outline shape may be submitted to a further thermal oxidation. During this second thermal oxidation, a layer of a thermal silicon oxide 5 was deposited on the SiGe mixed semiconductor layer. The patterned surface of the SiGe mixed semiconductor layer may also be coated with a dielectric. This has the advantage that the thermal oxidation takes place on all sides, and thus the danger of a non-conforming layer separating off may be avoided. Additional layer systems may also be deposited into which the conical sidewall outline shape set into the SiGe mixed semiconductor layer is transferred. After the micromechanical patterning, the SiGe mixed semiconductor layer having a conical sidewall outline shape is, for instance, able to form the basis for a subsequent depositing of diaphragm layers having a flattened mounting angle.

According to a second exemplary embodiment of the present invention, the method according to the present invention may be used to generate micromechanical patterns in a multilayer system, as shown by FIGS. 2a to 2d. The generation of appropriate micromechanical patterns is especially of advantage in the case of the production of a symmetrical three-layer system. If a germanium concentration gradient in an SiGe mixed semiconductor layer is not desired in the later method or layer build-up, but if, at the same time, there is a need for the thermal oxidation of this SiGe mixed semiconductor layer, a concentration gradient that is present, for instance, because of the depositing of an SiGe mixed semiconductor layer having a concentration gradient in situ, may be compensated for by superposing a second concentration gradient.

Figure 2A:
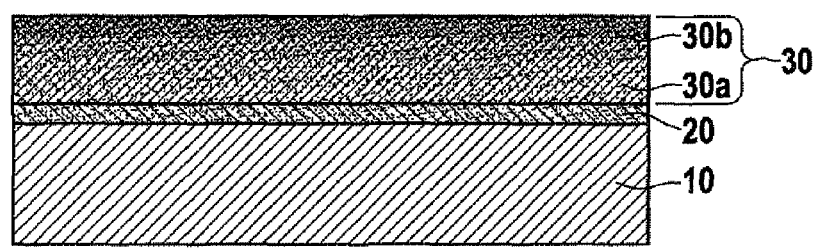
FIGS. 2a-2d show schematic cross-sectional views of production steps of micromechanical patterns according to a second specific example embodiment of the present invention.

A layer of a dielectric 20 was first applied onto a silicon semiconductor substrate 10, as shown in FIG. 2a. The dielectric is preferably formed of silicon dioxide. A SiGe mixed semiconductor layer 30, which has a concentration gradient of germanium in situ, was deposited onto the layer of dielectric 20, for instance, by a CVD method, a lower germanium concentration being present in upper layer area 30b, that was to be oxidized, than in lower layer area 30a, that is closer to the silicon substrate, as shown in FIG. 2a.

Figure 2B:
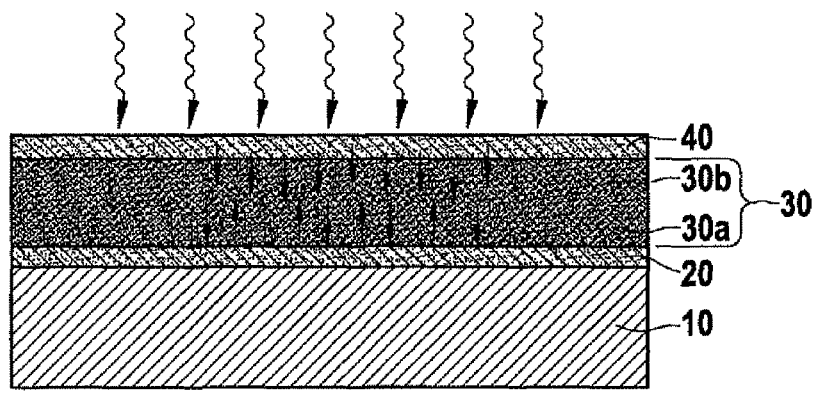

In a subsequent method step, shown in FIG. 2b, the concentration gradient developed in situ by the depositing of the SiGe mixed semiconductor layer was compensated for by thermal oxidation, represented by wavy arrows, the thermal oxidation generating a second concentration gradient of germanium, which compensates for the existing one or cancels it. By the thermal oxidation a thermal oxide 40 was grown on the SiGe mixed semiconductor layer, which is preferably developed of silicon oxide. The advantage is that, because of the diffusion of germanium during the thermal oxidation, the germanium concentration gradient in SiGe mixed semiconductor layer 30a, 30b is compensated for, a thermal oxide 40 being generated advantageously in addition. In the thermal oxidation of a SiGe mixed semiconductor layer having a concentration gradient present, it is of advantage that layer area 30b, which is close to the surface at which the thermal oxidation takes place, contains less germanium, and therefore, in the oxidation, a Ge-free oxide layer (based on the reduction of Ge oxide on Si atoms) may also be obtained at temperatures that are able to be lower than is required in a thermal oxidation of SiGe mixed semiconductor layers that have a higher proportion of germanium. For instance, a thermal oxidation of a SiGe mixed semiconductor layer 30a, 30b is able to take place at temperatures in the range of $\geq 800°$ C. to $\leq 900°$ C. The layer thickness of thermal oxide 40 is preferably in the range of 10 nm to 100 nm.

Figure 2C:
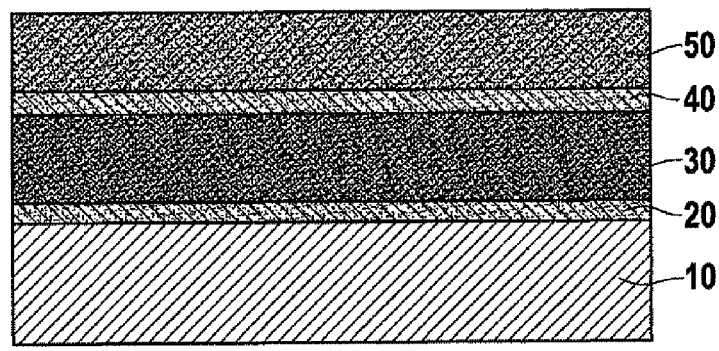

Onto SiGe mixed semiconductor layer 30 having a compensated germanium proportion and thermal oxide 40, an additional SiGe mixed semiconductor layer 50 was applied in a subsequent process step, as is shown in FIG. 2c. This SiGe mixed semiconductor layer 50 had a uniform germanium concentration over the thickness of the layer, which is preferably in the range of $x \geq 0.03$ to $\leq 0.4$.

Figure 2D:
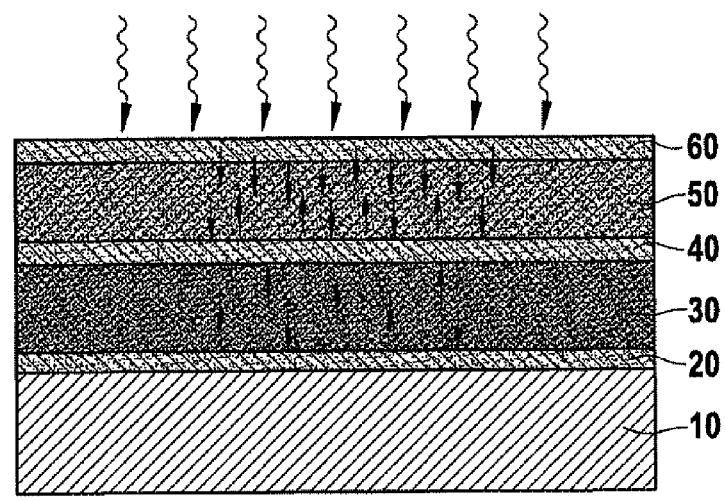

As shown in FIG. 2d, SiGe mixed semiconductor layer 50 was subsequently submitted to a further thermal oxidation. If SiGe mixed semiconductor layer 50 has a low germanium content over its entire thickness, the increase in the germanium concentration in the thermal oxidation in the upper nm may be negligible. Because of the thermal oxidation, a further layer of a thermal oxide 60 was generated.

In the method shown in FIGS. 2a to 2d, it is particularly of advantage that, because of the thermal oxidations, thermal silicon oxide layers 40 and 60 are able to be generated which form layers having comparable properties.

It is of particular advantage in this context that the thermal oxidations make possible a symmetrical inclusion of SiGe mixed semiconductor layer 50 having similar stable thermal oxides, which were generated under comparable conditions by thermal oxidations. SiGe mixed semiconductor layers 30 and 50 have a different germanium concentration, the concentration of SiGe layer 30 being greater than that of SiGe layer 50.

During a subsequent dry chemical etching using etching gas $ClF_3$, a selectivity of the etching process between the two SiGe mixed semiconductor layers 30 and 50 is able to be generated at the same etching parameters. In this case, the germanium concentrations of a so-called sacrificial layer, which is supposed to be removed to a great extent, or completely by dry chemical etching processes, should be higher than that of the additional SiGe layer.

In the case of dry chemical etching of the layer construction as shown in FIG. 2d, SiGe mixed semiconductor layer 30 is correspondingly etched away substantially faster than SiGe mixed semiconductor layer 50. This has the special advantage that these micromechanical patterns are able to be formed in one single dry chemical etching process.

In this case, the two SiGe mixed semiconductor layers 30 and 50 are separated by the thermally grown oxide 40. Such a pattern is of particular advantage in the case of producing diaphragms, for instance, in capacitive pressure sensors and microphones. In preferred specific embodiments, the SiGe mixed semiconductor layer is a $Si_{1-x}Ge_x$ mixed semiconductor layer having a germanium proportion where x is in the range of $\geq 0.01$ to $\leq 0.05$.

Although the present invention has been described above with reference to preferred exemplary embodiments, it is not limited thereto but rather is modifiable in many ways.

Preferred embodiments of the method according to the present invention are claimed by the dependent claims and elucidated in greater detail in the following text.

The germanium proportion in the SiGe mixed semiconductor layer is variable. For example, by depositing an SiGe layer using a CVD method (CVD=chemical vapor deposition), variable proportions of germanium within an SiGe layer may be set, which may be varied over the thickness of the layer. For instance, in the case of a deposition of an SiGe mixed semiconductor layer using a CVD method and using silane and germane, the proportion of silane and germane is variable, whereby the germanium proportion in the deposited layer is adjustable. This makes possible the production of a SiGe layer which, over the thickness of the layer, is able to have changing proportions of germanium. For example, an SiGe layer is able to have one or more areas having an increased germanium proportion over the thickness of the layer. These areas having an increased germanium proportion are etched out more strongly in a subsequent dry etching etching step, whereby recesses may form in these areas of the SiGe layer, as opposed to the areas having a lesser proportion of germanium. This enables the production of micromechanical patterns having a relief-like sidewall outline shape. The concept "relief-like" has the meaning, within the sense of the present invention, that a sidewall outline shape over the thickness of the layer has recesses or protruding region.

Furthermore, a constantly changing proportion of germanium or a concentration gradient may be set over the thickness of a SiGe mixed semiconductor layer, for instance, by the thermal oxidation of a SiGe mixed semiconductor layer.

In a SiGe mixed semiconductor layer for producing micromechanical patterns having a conical sidewall outline shape, a concentration gradient of germanium is preferably able to be formed. In preferred specific embodiments, the gradient of the germanium proportion in a SiGe mixed semiconductor layer may be developed continuously or varying stepwise. A gradient that is developed stepwise is able to be developed, for instance, by depositing a SiGe layer, a stepwise variation of the concentration gradient being able to be developed in situ by increasing the germane proportion, in the SiGe deposition.

One variation of the germanium proportion is able to be set, for example, by depositing a SiGe mixed semiconductor layer, having a germanium content that varies over the thickness of the layer, especially by methods selected from the group including depositing a SiGe mixed semiconductor layer especially by CVD methods, introducing germanium into a silicon semiconductor layer or a SiGe mixed semiconductor layer, introducing silicon into a germanium layer or a SiGe mixed semiconductor layer and/or by thermal oxidation of a SiGe mixed semiconductor layer.

It may be provided that a combination of the methods is to be used.

The term "is able to be set", in the sense of the present invention, particularly has the meaning that a variation is able to be developed or to be influenced.

For instance, varying germanium proportions or germanium gradients are able to be set in SiGe layers, with ease and reproducibly, using ramped CVD methods. It is of special advantage, in this instance, that when the SiGe layers are deposited, both increasing and decreasing concentrations of germanium are able to be produced.

In the case of the thermal oxidation of an SiGe mixed semiconductor layer, a concentration gradient of the germanium is set by having a directed diffusion of the germanium take place while developing a gradient.

A constant or continuous gradient without discontinuities is of advantage. This may provide the advantage that the conical sidewall outline shape produced is also able to have a continuous outline shape without discontinuities.

In preferred specific embodiments, in order to produce micromechanical patterns having a conical sidewall outline shape, one may form gradients in the germanium proportion in the SiGe mixed semiconductor layer that run over the thickness of the layer.

The gradient developed in the SiGe mixed semiconductor layer preferably acts directly on the etching rate of the dry chemical etching. In this connection, the angle of inclination of the etched conical sidewall outline shape is able to be set via the selection of the SiGe layer composition. The angle of inclination may be in the range of $>0°$ to $\leq 90°$. A pronounced gradient of the germanium concentration may generate a flat angle of inclination of the etched sidewall.

A further particular advantage of the development of a concentration gradient is that thereby the properties of the layer, for instance, the setting of mechanical stress conditions or electrical properties, for the respective application of a mechanical component, are able to be optimized.

In other specific embodiments of the method according to the present invention, for instance, a gradient of the germanium concentration, deposited in situ, is able to be removed or compensated for by a thermal oxidation by a second concentration gradient. An oxidation of a SiGe layer, in which an originally present concentration gradient is removed by superposition using a second concentration gradient, may lead to a compensation of the concentration gradient of the germanium proportion in the layer and, upon subsequent dry chemical etching of the SiGe layer, to the development of a vertical sidewall outline shape.

Such a method is advantageous particularly if, at the beginning of the thermal oxidation, a lower germanium concentration is required in the area of the SiGe layer that is to be oxidized, for example, in order to obtain an oxide of high purity, but in this layer there is a wall, running vertically, that is to be etched out, for which a homogeneous composition of the SiGe layer is required. In this instance, the advantage is that the layer area that is close to the surface, on whose surface a thermal oxide is developed by the thermal oxidation, contains less germanium, and consequently is able to be oxidized at lower temperatures to a Ge-free oxide than a SiGe layer having a higher germanium content.

One particularly preferred method for setting a concentration gradient is the thermal oxidation of a SiGe mixed semiconductor layer. A thermal oxide forms on the surface of the SiGe layer during the thermal oxidation. During the thermal oxidation, germanium is excluded from the thermal oxide formed, and diffuses into the SiGe layer. In the process, a concentration gradient is developed in the silicon-germanium layer, and by the diffusion of the germanium, higher germanium concentrations being developed in areas of the layer near the oxide formed and based on the diffusion paths of the germanium, the germanium gradient developed decreases in the direction of the depth of the layer.

The etching rate of SiGe rises with an increasing germanium proportion in the layer. In a subsequent dry chemical etching, a greater removal of the SiGe layer takes place in the area, that is closer to the oxide layer formed, which has a higher germanium concentration than in lower lying areas that have lower germanium concentrations. A conical sidewall outline shape is thereby developed.

The germanium which is not integrated into the thermal oxide, that is developed by the thermal oxidation process, diffuses into the SiGe layer lying below the oxide. At temperatures that do not make possible a sufficient diffusion of the germanium in the SiGe layer, a so-called germanium pile-up may form at the boundary layer of the thermal oxide developed and the SiGe layer. If the temperatures during the thermal oxidation method are high enough for activating the diffusion of the germanium, the germanium diffuses deeper into the SiGe layer.

In preferred specific embodiments, the temperature at which the thermal oxidation of the SiGe mixed semiconductor layer is carried out, is in a range of $\geq 800°$ C. to $\leq 1300°$ C. It is preferred that the thermal oxidation be carried out at temperatures in the range of $\geq 900°$ C. to $\leq 1200°$ C. It is especially preferred that the thermal oxidation be carried out at temperatures in the range of $\geq 1000°$ C. to $\leq 1100°$ C.

A thermal oxidation for producing micromechanical patterns, having a vertical sidewall outline shape, by removing an existing concentration gradient by superposing with a second one by thermal oxidation, may be carried out at temperatures in a range of $\geq 800°$ C. to $\leq 900°$ C., for example. Such a compensation of a concentration gradient, that is present, by a second concentration gradient is also able to be developed by introducing germanium into silicon or silicon-germanium layers or by introducing silicon into germanium or SiGe layers.

An additional preferred possibility is the introduction of germanium or silicon using methods of doping or implantation. One advantage of doping methods and implantation methods is particularly that in these methods local gradients are able to be set. This may provide the possibility of making available various gradients in an SiGe layer that is to be etched.

The doping may basically be done by each doping process conventional to semiconductor technology, but doping from the gaseous phase is preferred. In particular, introducing germanium into layers based on silicon, especially SiGe mixed semiconductors may be done by implantation methods. Introducing germanium or silicon preferably takes place by implantation of germanium ions or silicon ions, which are preferably able to be generated from a suitable ion source. This has the particular advantage that, for instance, using a focused germanium ion beam, areas to be etched of a silicon layer or an SiGe layer may be selectively removed and enriched with germanium. This permits an extremely selective introduction of germanium at the areas of the silicon layer or the SiGe layer that are to be etched. It is particularly of advantage, in this instance, that local gradients are able to be developed.

Methods for introducing germanium or silicon into layers that are to be etched, are preferred if germanium is to be introduced into a silicon layer or silicon is to be introduced into a germanium layer. It is also possible to introduce germanium into a SiGe mixed semiconductor layer. It is also preferred that one should implant silicon into a pure germanium layer or into a substrate based on germanium. In this case, areas that are not to be removed are doped with silicon.

The content of silicon and germanium in a SiGe mixed semiconductor layer may vary, as required. It is preferred if a SiGe mixed semiconductor layer is an $Si_{1-x}Ge_x$ mixed semiconductor layer. In a preferred manner, the value of x in an $Si_{1-x}Ge_x$ layer is less than 0.5. Such a composition of a SiGe mixed semiconductor layer may provide the advantage that, for instance, in a thermal oxidation of the silicon-germanium, pure silicon dioxide is created on the SiGe mixed semiconductor layer. A higher proportion of germanium in a SiGe mixed semiconductor layer may have the result that, instead of pure silicon dioxide, germanium-silicon oxide mixed oxides could be created. It is of particular advantage if pure silicon oxide is able to be developed by a thermal oxidation, since such a layer is able to provide a diffusion barrier between the SiGe mixed semiconductor layer lying below it and possible additional layers based on silicon that are deposited on the oxide.

The germanium proportion in an $Si_{1-x}Ge_x$ mixed semiconductor layer preferably has a value for x in the range of $\geq 0.01$ to <1, preferably in a range of $\geq 0.01$ to $\leq 0.6$, further preferred in a range of $\geq 0.01$ to $\leq 0.4$. In preferred specific embodiments, the germanium proportion in an $Si_{1-x}Ge_x$ mixed semiconductor layer has a value for x in the range of $\geq 0.01$ to <0.5, preferably in a range of $\geq 0.03$ to $\leq 0.4$, preferably in a range of $\geq 0.05$ to $\leq 0.3$, and particularly preferred, in a range of 0.1 to 0.2. These ranges are able to provide the advantage that a controlled etching process is made available that is controllable particularly in the etching speed and, at the same time, is highly selective with respect to silicon and silicon oxide. The selectivity of the dry chemical etching of such an $Si_{1-x}Ge_x$ layer with respect to silicon may be in the range of about 4000:1 to 10000:1, for example, and with respect to silicon oxide may even amount to about 100000:1. This makes possible that micromechanical patterns having a relief-like sidewall outline shape, or an adjustable angle of inclination, may be etched out of SiGe mixed semiconductor layers, whereas additional layers present on a silicon substrate and based on silicon are not affected by the etching process and especially are not destroyed by it.

It is advantageous, especially in methods of thermal oxidation, that x<0.5, so that the germanium proportion in the SiGe mixed semiconductor layer amounts to less than 50%. This may provide the advantage that a thermal oxide grown on such a layer contains no germanium, because germanium oxides possibly formed by the thermal oxidation are reduced, by the silicon excess at the boundary layer of silicon-germanium, to oxide by the silicon, silicon dioxide being formed. Under these conditions, a silicon oxide may be obtained, in an advantageous manner, which is free of germanium oxide to the greatest extent.

This may provide the advantage that diffusion of germanium through purer silicon oxide layers may be better reduced or even prevented than through layers that would contain germanium oxide. The functionality of the thermal oxide as a diffusion barrier between a SiGe mixed semiconductor layer and other adjacent layers based on silicon may consequently be improved.

A thermal oxide, developed by the thermal oxidation of a SiGe mixed semiconductor layer, is able to provide the advantage that, as a dielectric, a diffusion barrier or as a protective layer for subsequent method steps in the production of micromechanical components, may be maintained, if necessary, as a layer in a layer system.

The thickness of the oxide layer may vary. One particular advantage of an oxide formed by the thermal oxidation of a SiGe mixed semiconductor layer may therefore be provided by its being usable in microsystems technology especially as a dielectric. In particular, it is of advantage that, when the thermal oxidation is carried out in already prepatterned silicon-germanium, the dielectric layer that is developed does not have to be patterned all over again in an additional method step. It is of particular advantage, in this instance, that even if additional silicon patterns are present on the surface of a silicon substrate, besides the silicon-germanium patterns that are to be oxidized, the oxidation rate of silicon-germanium is twice as great as that of silicon. Consequently, silicon-germanium areas are able to be oxidized in a highly selective manner, in contrast to pure silicon. For a further use as a dielectric, the thickness of the layer of the thermal oxide is in the range of a few micrometers, in a range of 1 μm to 3 μm, for example.

Furthermore, the oxide layer generated by the thermal oxidation is able to be used as a diffusion barrier between the SiGe layer, usable mostly as a sacrificial layer and functional silicon layers lying above or below it. This particularly provides the advantage that one does not have to fall back on qualitatively less suitable oxides which, for example, have to be applied using PECVD methods ("plasma enhanced chemical vapor deposition"). A pure silicon oxide layer, that is able to be generated by thermal oxidation, is advantageously able to reduce or even prevent the diffusing out of germanium into adjacent layers based on silicon. A necessity of inserting diffusion barriers for germanium between SiGe sacrificial layers and silicon layers exists especially in cases in which, after the depositing of an SiGe layer onto the silicon substrate, further high temperature steps are provided which bring on additional diffusion of germanium because of the high temperature. The thickness of such a diffusion barrier is preferably in the range of 10 nm to 100 nm.

Plasma-less dry chemical etching methods are the preferred methods. Preferably usable etching reagents for the dry chemical etching are selected from the group $ClF_3$, $ClF_5$ and/oder $BrF_3$. $ClF_3$ is a particularly preferred etching gas. In particular, it could be determined that plasma-less etching using $ClF_3$ has etching rates that are nearly independent of the layer thickness. This provides the advantage that the thickness of sacrificial layers that are to be etched demonstrates no negative influence on the etching of these sacrificial layers.

In preferred specific embodiments, the dry chemical etching of the SiGe mixed semiconductor layer is carried out at a temperature of the Si semiconductor substrate and/or of the SiGe mixed semiconductor layer in the range of $\geq -30°$ C. to $\leq 60°$ C., preferably in the range of $\geq -20°$ C. to $\leq 40°$ C., and more preferably in the range of $\geq -10°$ C. to $\leq 10°$ C. It is advantageous that, under these conditions, a SiGe layer is able to be etched selectively with respect to silicon and with respect to dielectric layers based on silicon, such as silicon oxide or silicon nitride, without requiring additional protective measures for passivating them.

It is also preferred that the dry chemical etching of the SiGe mixed semiconductor layer is carried out at a pressure in the range of $\geq 0.1$ Pa to $\leq 1000$ Pa, more preferred in a range of $\geq 8$ Pa to $\leq 400$ Pa and most preferred in a range of $\geq 10$ Pa to $\leq 100$ Pa.

One additional subject matter of the present invention relates to micromechanical patterns having a relief-like sidewall outline shape or an angle of inclination that is able to be set, produced according to the example method of the present invention.

The micromechanical silicon-germanium patterns that are able to be produced according to the example method of the present invention are particularly suitable as sacrificial layers. In an advantageous manner, additional layer systems may be deposited onto the silicon-germanium patterns, onto which the sidewall outline shape that is able to be set in the silicon-germanium layer, that is conical, for instance, is transferred. This makes possible, for example, an application in the production of diaphragms not having level mounting. Silicon-germanium patterns having a conical sidewall outline shape make possible, for example, a subsequent depositing of diaphragm layers having a flattened mounting angle. Diaphragms of micromechanical components are a part of micromechanical sensor elements, for example.

Furthermore, the development of a concentration gradient, of germanium, for instance, by implantation, makes it possible for a plurality of etching regions to be produced side by side, the implantation being limited to these regions. This enables the application of the method according to the present invention to the production of microneedles, for example.

Moreover, micromechanical patterns having a relief-like sidewall outline shape or an angle of inclination that is able to be set, according to the example method of the present invention, particularly vertical or conical sidewall outline shapes, are advantageously usable before the depositing of layers in response to which there may be problems with steps that are to be vertically coated, because of their comparatively poor conformity, for example, in PECVD processes, sputter processes or in the case of particularly thin layers. In addition, micromechanical sensors offer advantageous application possibilities of the method and of the micromechanical patterns that are able to be produced having a relief-like sidewall outline shape or an angle of inclination that may be set.

What is claimed is:

1. A method for producing micromechanical patterns having a relief-like sidewall outline shape or an adjustable angle of inclination, comprising:
    developing the sidewall outline shape of the micromechanical pattern by varying a germanium proportion in a SiGe mixed semiconductor layer that is present on or deposited on a silicon semiconductor substrate, a greater germanium proportion being present in regions that are to be etched more strongly, the variation in the germanium proportion in the SiGe mixed semiconductor layer being set by a method selected from a group including at least one of: (i) depositing a SiGe mixed semiconductor layer having varying germanium content, (ii) introducing germanium into a silicon semiconductor layer or a SiGe mixed semiconductor layer, (iii) introducing silicon into a germanium layer or a SiGe mixed semiconductor layer, and (iv) thermally oxidizing a SiGe mixed semiconductor layer; and
    dry chemical etching the micromechanical patterns out of the SiGe mixed semiconductor layer.

2. The method as recited in claim 1, wherein a gradient is developed of the germanium proportion in the SiGe mixed semiconductor layer that is one of continuous or varies stepwise.

3. The method as recited in claim 1, wherein the dry chemical etching produces micromechanical patterns having a conical sidewall outline shape, a gradient of the germanium proportion in the SiGe mixed semiconductor layer being developed that runs over a thickness of the layer.

4. The method as recited in claim 1, wherein one of germanium or silicon are introduced by one of doping or implantation.

5. The method as recited in claim 1, wherein the SiGe mixed semiconductor layer is thermally oxidized at a temperature in a range of $\geq 800°$ C. to $\leq 1300°$ C.

6. The method as recited in claim 5, wherein the range is $\geq 900°$ C. to $\leq 1200°$ C.

7. The method as recited in claim 6, wherein the range is $\geq 1000°$ C. to $\leq 1100°$ C.

8. The method as recited in claim 1, wherein the SiGe mixed semiconductor layer is an $Si_{1-x}Ge_x$ mixed semiconductor layer having a germanium proportion of x in a range of $\geq 0.01$ to $<1$.

9. The method as recited in claim 8, wherein the range is $\geq 0.01$ to $<0.5$.

10. The method as recited in claim 9, wherein the range is $\geq 0.03$ to $\leq 0.4$.

11. The method as recited in claim 10, wherein the range is $\geq 0.05$ to $\leq 0.3$.

12. The method as recited in claim 11, wherein the range is $\geq 0.1$ to $\leq 0.2$.

13. The method as recited in claim 1, wherein the dry chemical etching of the SiGe mixed semiconductor layer is carried out using an etching gas selected from the group comprising $ClF_3$, $ClF_5$ and $BrF_3$.

14. The method as recited in claim 1, wherein the dry chemical etching of the SiGe mixed semiconductor layer is carried out at a temperature of at least one of silicon semiconductor substrate and a SiGe mixed semiconductor layer in a range of $\geq -30°$ C. to $\leq 60°$ C.

15. The method as recited in claim 14, wherein the range is $\geq -20°$ C. to $\leq 40°$ C.

16. The method as recited in claim 15, wherein the range is $\geq -10°$ C. to $\leq 10°$ C.

17. The method as recited in claim 1, wherein the dry chemical etching of the SiGe mixed semiconductor layer is carried out at a pressure in the range of $\geq 0.1$ Pa to $\leq 1000$ Pa.

18. The method as recited in claim 17, wherein the range is $\geq 8$ Pa to $\leq 400$ Pa.

19. The method as recited in claim 18, wherein the range is $\geq 10$ Pa to $\leq 100$ Pa.

* * * * *

UNITED STATES PATENT AND TRADEMARK OFFICE
CERTIFICATE OF CORRECTION

PATENT NO. : 8,501,516 B2
APPLICATION NO. : 12/740607
DATED : August 6, 2013
INVENTOR(S) : Laermer et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 395 days.

Signed and Sealed this

Fifteenth Day of September, 2015

Michelle K. Lee
*Director of the United States Patent and Trademark Office*